(12) United States Patent
Kumar et al.

(10) Patent No.: US 11,387,834 B1
(45) Date of Patent: Jul. 12, 2022

(54) METHODS AND APPARATUS TO IMPLEMENT PULSE SWALLOWING CIRCUITRY IN A PHASE FREQUENCY DETECTOR

(71) Applicant: Texas Instruments Incorporated, Dallas, TX (US)

(72) Inventors: Pranav Kumar, Ranchi (IN); Abhrarup Barman Roy, Kolkata (IN); Apoorva Bhatia, Lucknow (IN); Arpan Sureshbhai Thakkar, Gujarat (IN); Jagdish Chand, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/319,819

(22) Filed: May 13, 2021

(51) Int. Cl.
*H03L 7/091* (2006.01)
*H03L 7/18* (2006.01)
*H03L 7/081* (2006.01)
*H03L 7/099* (2006.01)
*H03L 7/089* (2006.01)

(52) U.S. Cl.
CPC .............. *H03L 7/091* (2013.01); *H03L 7/081* (2013.01); *H03L 7/0891* (2013.01); *H03L 7/099* (2013.01); *H03L 7/1803* (2013.01)

(58) Field of Classification Search
CPC ......... H03L 7/081; H03L 7/085; H03L 7/087; H03L 7/089; H03L 7/0891; H03L 7/091; H03L 7/099; H03L 7/16; H03L 7/18; H03L 7/1803
See application file for complete search history.

(56) References Cited

U.S. PATENT DOCUMENTS 10,840,918 B2 * 11/2020 Takai ................... G11C 7/1072
2004/0085103 A1 * 5/2004 Ahn ...................... H03L 7/1978
327/156

OTHER PUBLICATIONS

Mittal et al. "Design of Charge Pump Circuit for PLL Application: A review". International Journal of Engineering Research & Technology (IJERT), 4(5), May 5, 2015, 296-299 (4 pages).

* cited by examiner

*Primary Examiner* — Diana J. Cheng
(74) *Attorney, Agent, or Firm* — Michael T. Gabrik; Charles A. Brill; Frank D. Cimino

(57) ABSTRACT

An example apparatus includes: a first flip flop having a first output and a first reset input, a second flip flop having a first data input, a second output, and a second reset input, the second reset input coupled to the first reset input, a logic gate having a first logic input, a second logic input, and a first logic output, the first logic input coupled to the first output and the second logic input coupled to the second output, a delay cell having a delay cell input and a delay cell output, the delay cell input coupled to the first logic output and the delay cell output coupled to the first reset input and the second reset input, and pulse swallowing circuitry having a circuitry input and a circuitry output, the circuitry input coupled to the second output and the circuitry output coupled to the first data input.

18 Claims, 3 Drawing Sheets

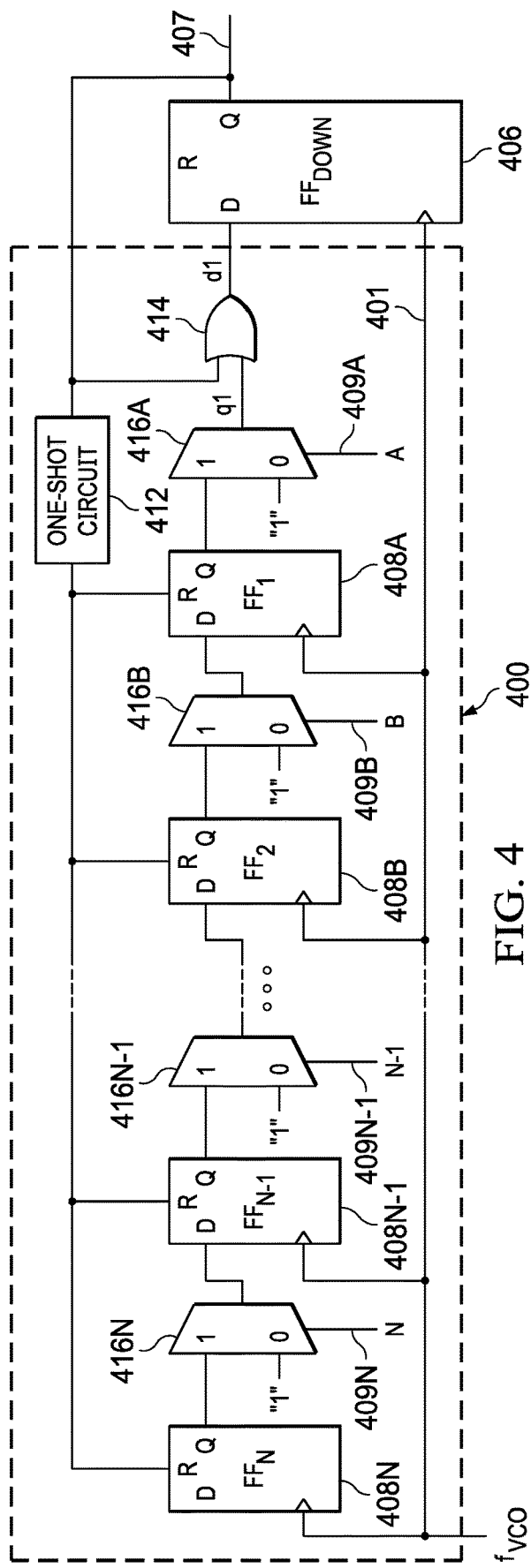
FIG. 4
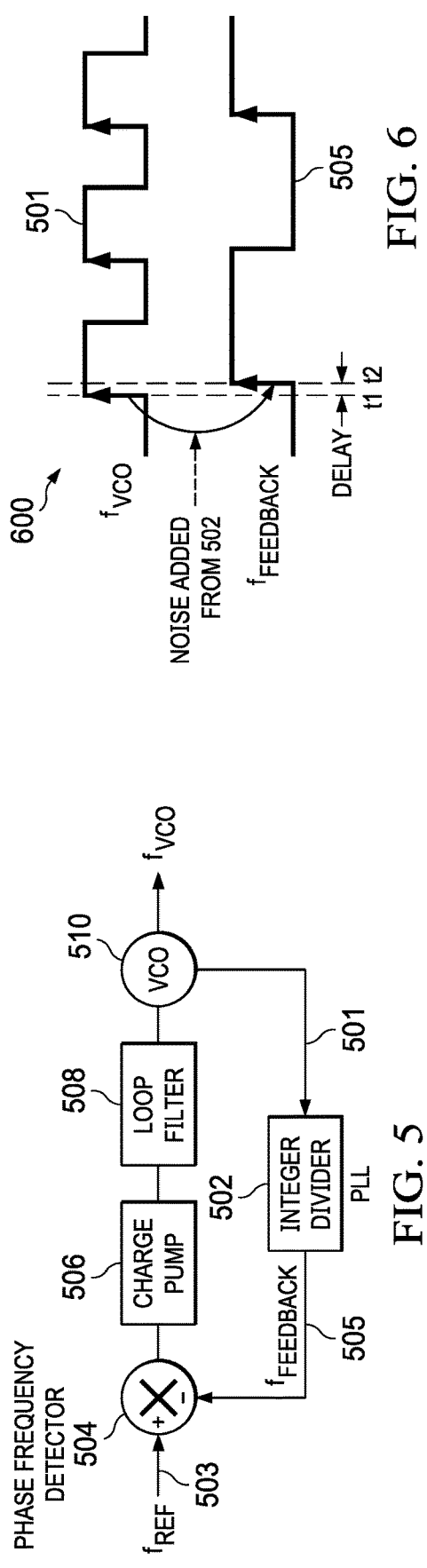
FIG. 5
FIG. 6

METHODS AND APPARATUS TO IMPLEMENT PULSE SWALLOWING CIRCUITRY IN A PHASE FREQUENCY DETECTOR

TECHNICAL FIELD

This description relates generally to phase frequency detectors, and more particularly to methods and apparatus to implement pulse swallowing circuitry in a phase frequency detector.

BACKGROUND

Phase locked loops (PLLs) are commonly used to synchronize a first clock signal (e.g., operating at a desired frequency) to a second clock (e.g., operating at a reference frequency). PLLs commonly include a phase detector to detect and/or to operate on a phase difference between the first and second clocks. To facilitate the detection of the phase difference between the first and second clock signals, the first clock signal may be divided down by a factor of M, where M is a ratio of the desired frequency and the reference frequency. Other functional blocks typically included in PLLs are a loop filter to filter an output of the phase detector to reduce the effects of higher frequency noise. An output signal of the loop filter is then used to control an oscillator (e.g., a voltage controlled oscillator (VCO)) that generates the first (i.e., desired) clock signal.

SUMMARY

For methods and apparatus to implement pulse swallowing circuitry in a phase frequency detector, an example apparatus includes a phase frequency detector (PFD). The PFD comprises a first flip flop having a first output and a first reset input. The PFD comprises a second flip flop having a first data input, a second output, and a second reset input, the second reset input coupled to the first reset input. The PFD comprises a logic gate having a first logic gate input, a second logic gate input, and a first logic gate output, the first logic gate input coupled to the first output and the second logic gate input coupled to the second output. The PFD comprises a delay cell having a delay cell input and a delay cell output, the delay cell input coupled to the first logic gate output and the delay cell output coupled to the first reset input and the second reset input. The PFD comprises pulse swallowing circuitry having a circuitry input and a circuitry output, the circuitry input coupled to the second output and the circuitry output coupled to the first data input.

BRIEF DESCRIPTION OF THE DRAWINGS

FIG. 4 is an example schematic diagram of a pulse swallowing circuit that implements a divide by N operation.

FIG. 5 is a block diagram of a phase-locked loop (PLL) including an integer divider in a feedback network.

FIG. 6 is a second timing diagram illustrating signals through the PLL of FIG. 5 during operation to depict the noise added by the integer divider between an output clock signal and a feedback clock signal.

The same reference numbers or other reference designators are used in the drawings to designate the same or similar (functionally and/or structurally) features.

DETAILED DESCRIPTION

PLLs are implemented by a number of applications, including frequency multiplication applications. A frequency multiplication application may be utilized by a system to generate a desired frequency that is greater than an input and/or reference frequency. In some examples, the PLL is used instead of an oscillator that directly provides the desired frequency because such an oscillator may be costly relative to a low-frequency oscillator, the PLL can adjust the desired frequency without making any hardware modifications to system, etc.

To enable the frequency multiplication in the PLL, a feedback factor is required to feed the output frequency into a frequency divider, such as an integer divider, that divides the output frequency by a factor of M to generate a divided clock signal, where M is a ratio of the desired frequency and the reference frequency. Such a feedback factor is used to detect the phase difference between the reference and/or input frequency and the output frequency. The frequency and/or integer divider introduces jitter at every edge of the divided clock signal. Jitter and/or clock jitter are terms used to describe clock signal quality. For example, jitter is an amount of deviation from the desired frequency over time. Jitter typically is defined/measured in time domain, such as period jitter, cycle-to-cycle jitter, and accumulated jitter. For example, an oscillator outputs a clock signal that is equivalent to 100 MHz. On a plot of frequency vs time, the frequency is a straight line for an ideal oscillator. However, in reality, there is jitter that causes the frequency to vary from the 100 MHz and, thus, the line is not a perfectly straight line. Jitter can also be defined/measured in a frequency domain, such as integrated rms (root mean square) jitter, which is calculated based on measured phase noise spectrum. In some examples, the jitter introduced by the frequency and/or integer divider can be reduced with extra power investment (e.g., by providing higher currents to the frequency and/or integer divider). However, such a power investment may exceed an overall power budget of the PLL.

Examples disclosed herein eliminate the need for a frequency divider in the feedback factor of the PLL and improve overall jitter of the PLL. The example PLL disclosed herein includes a phase frequency detector (PFD) that implements pulse swallowing circuitry, which mimics frequency division and, thus, eliminates the need for the frequency divider in the feedback factor. The example PFD disclosed herein is coupled directly to the output of the PLL, which is the output of a voltage controlled oscillator (VCO), such that little to no jitter is induced by the PLL during frequency division and, thus, less power (e.g., quiescent current) is consumed relative to a PLL having a frequency divider in the feedback factor.

Figure 1:
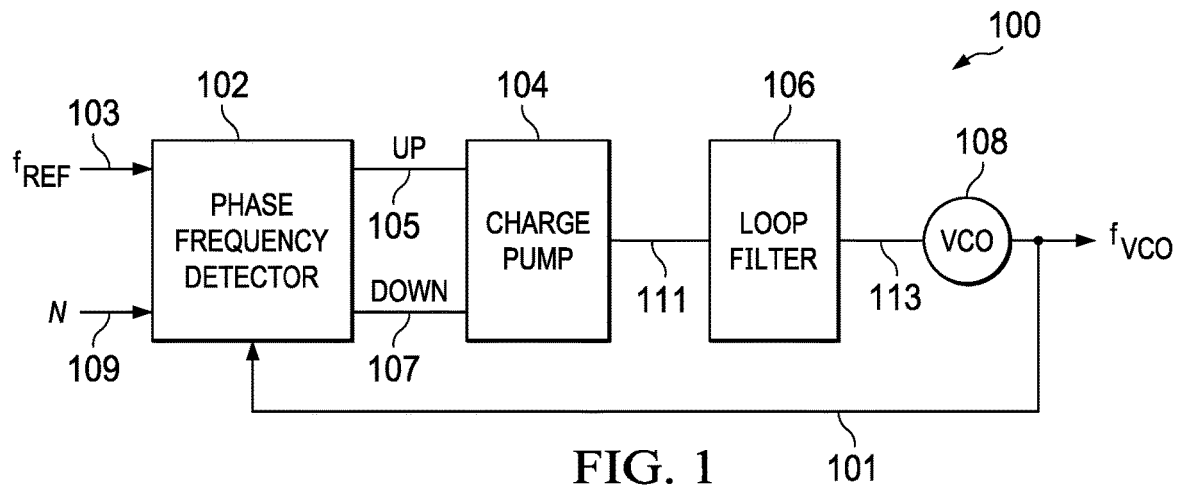
FIG. 1 is a block diagram of an example phase-locked loop (PLL) to synchronize a first clock signal to a second clock signal.

FIG. 1 is a block diagram of an example phase-locked loop (PLL) 100 to synchronize a first clock signal ($f_{vco}$) 101 to a second clock signal ($f_{ref}$) 103. The example PLL 100 of FIG. 1 includes an example phase frequency detector (PFD)

102, an example charge pump 104, an example loop filter 106, and an example voltage-controlled oscillator (VCO) 108.

In FIG. 1, the example PFD 102 is coupled to an output of the VCO 108 and configured to receive the first clock signal ($f_{vco}$) 101 and the second clock signal ($f_{ref}$) 103. The example PFD 102 is to bring a frequency of the first clock signal ($f_{vco}$) 101 closer to a frequency of the second clock signal ($f_{ref}$) 103. For example, the PFD 102 is to detect a phase difference between the first clock signal ($f_{vco}$) 101 and the second clock signal ($f_{ref}$) 103 and translate the phase difference into two signals—UP signal 105 and down signal 107, which are used to adjust the frequency of the first clock signal 101 to be in-phase with the frequency of the second clock signal ($f_{ref}$) 103. In some examples, the first clock signal ($f_{vco}$) 101 has a frequency that is greater than the frequency of the second clock signal ($f_{ref}$) 103 by a factor of N. In such an example, the first clock signal ($f_{vco}$) 101 has to be divided by the same factor N, in order for the PFD 102 to accurately detect the phase difference between the first clock signal 101 and the second clock signal 103. In some examples, the factor N is provided as a control signal 109. The example PFD 102 is configured to receive the control signal 109 in order to divide the first clock signal 101. The example PFD 102 is described in further detail below in connection with FIG. 2.

In FIG. 1, the example charge pump 104 is coupled to the PFD 102 and the loop filter 106 and is configured to receive the UP signal 105 and the DOWN signal 107. The example charge pump 104 generates an output current 111 at its output that increases a voltage supplied to the VCO 108, decreases the voltage supplied to the VCO 108, and/or does not change (e.g., keeps constant) the voltage supplied to the VCO 108. For example, when the UP signal 105 and the DOWN signal 107 are indicative of no phase difference (e.g., the first clock signal ($f_{vco}$) 101 and the second clock signal ($f_{ref}$) 103 are aligned), the output current 111 of the charge pump 104 remains constant. In some examples, when the UP signal 105 is high (logic high) and the down signal 107 is low (logic low), the output current 111 of the charge pump 104 steadily increases. In some examples, when the DOWN signal 107 is high (logic high) and the UP signal 105 is low (logic low), the output current 111 of the charge pump 104 steadily decreases.

In FIG. 1, the example loop filter 106 is coupled to the example charge pump 104 and the example VCO 108 and is configured to receive the output current 111. The example loop filter 106 generates an output voltage 113 that increases, decreases and/or remains constant based on the output current 111. For example, the loop filter 106 may comprise a capacitor that is to be charged by output current 111 when the UP signal 105 is high and the DOWN signal 107 is low and/or is to be discharged by the output current 111 when the UP signal 105 is low and the DOWN signal 107 is high. The example loop filter 106 supplies the example VCO 108 with the output voltage 113 that causes the VCO 108 to adjust the frequency of the first clock signal 101.

In FIG. 1, the example VCO 108 is coupled to the loop filter 106 and is configured to receive output voltage 113. The example VCO 108 modulates the first clock signal 101 based on the output voltage 113 to generate the first clock signal 101. In some examples, the VCO 108 generates a clock signal that is greater in frequency than a reference clock signal by a factor of N. In some examples, the VCO 108 is implemented by a harmonic oscillator. In some examples, the VCO 108 is implemented by a relaxation oscillator. In some examples, the output of the VCO 108 (e.g., the first clock signal 101) is improved by the PFD 102. For example, the PFD 102 eliminates and/or reduces jitter, noise, etc., added in the first clock signal 101, as described in further detail below in connection with FIG. 2.

Figure 2:
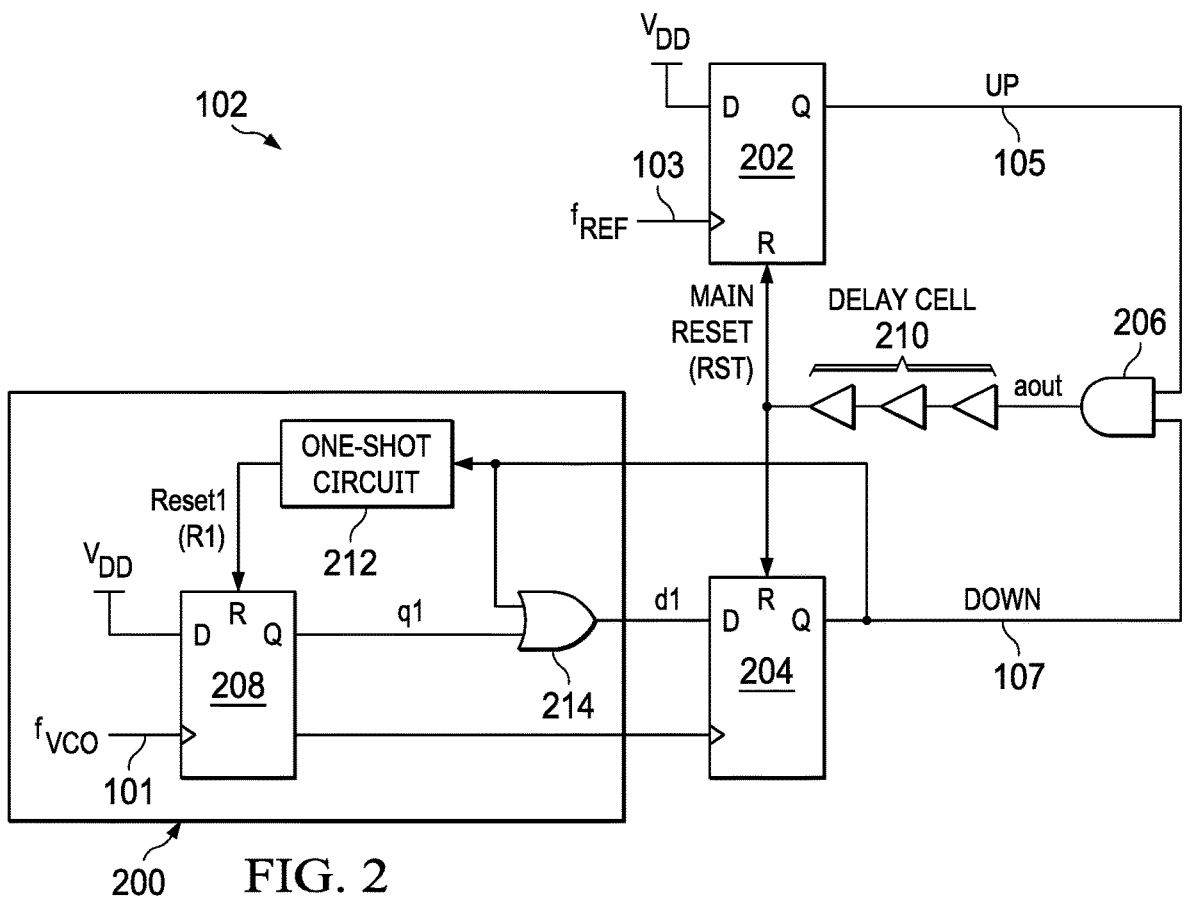
FIG. 2 is a schematic diagram of an example phase frequency detector of FIG. 1 including example pulse swallowing circuitry to mimic frequency division of the first clock signal and to detect a phase difference between the first clock signal and the second clock signal of FIG. 1.

FIG. 2 is a schematic diagram of the example PFD 102 of FIG. 1 including example pulse swallowing circuitry 200 to mimic frequency division of the first clock signal ($f_{vco}$) 101 and to detect the phase difference between the first clock signal ($f_{vco}$) 101 and the second clock signal ($f_{ref}$) 103. The example PFD 102 includes an example first flip flop (FF1) 202, an example second flip flop (FF2), an example first logic gate 206, an example third flip flop 208, an example delay cell 210, an example one-shot circuit 212, and example second logic gate 214. The example third flip flop 208, the example one-shot circuit 212, and the example second logic gate 214 make up the example pulse swallowing circuitry 200.

In FIG. 2, the example first flip flop 202, the example second flip flop 204, and the example third flip flop 208 are implemented by D-type flip flops. Additionally and/or alternatively, the example first flip flop 202, the example second flip flop 204, and the example third flip flop 208 may be implemented by set/reset (SR) latches, JK-type flip-flops, T-type flip-flops, and/or any type of basic latch and/or flip-flop.

In FIG. 2, the example first logic gate 206 is an AND gate (e.g., an AND logic gate, a logic AND gate, etc.). Additionally and/or alternatively, the example first logic gate 206 may be any type of logic gate, such an OR gate, a NAND gate, a XOR gate, etc. In FIG. 2, the example second logic gate 214 is an OR gate (e.g., an OR logic gate, a logic OR gate, etc.). Additionally and/or alternatively, the second logic gate 214 may be any type of logic gate, such as an AND gate, a NOR gate, an XOR gate, etc.

In FIG. 2, the example one-shot circuit 212 is a combinatorial logic circuit that generates an output pulse when triggered. For example, when the one-shot circuit 212 is triggered, a pulse of pre-defined duration is produced by the one-shot circuit 212. The one-shot circuit 212 returns to a stable state after the pre-defined duration and discontinues producing output until triggered again. In some examples, the one-shot circuit 212 is a mono-shot 212.

In FIG. 2, the example first flip flop 202 includes a first input (D), a first output (Q), a first clock input, and a first reset input (R). The example second flip flop 204 includes a second input (D), a second output (Q), a second clock input, and a second reset input (R). The example third flip flop 208 includes a third input (D), a third output (Q), a third clock input, and a third reset input (R). In FIG. 2, the example first logic gate 206 includes an UP logic gate input, a DOWN logic gate input, and a first logic gate output. The example second logic gate 214 includes a q1 input, a DOWN logic gate input, and a d1 output. In FIG. 2, the example delay cell 210 includes a delay cell input and a main reset output. In FIG. 2, the example one-shot circuit 212 includes a DOWN input and a reset output (R1).

In FIG. 2, the example first input (D) of the first flip flop 202 is coupled to a supply voltage ($V_{DD}$), the example first clock input of the first flip flop 202 is configured to receive the second clock signal ($f_{ref}$) 103, the example first output (Q) of the first flip flop 202 is coupled to the UP logic gate input of the first logic gate 206, and the first reset input (R) of the first flip flop 202 is coupled to the main reset output of the delay cell 210. The delay cell input of the example delay cell 210 is coupled to the first logic gate output of the first logic gate 206. The example first logic gate output 206 outputs a voltage aout.

In FIG. 2, the example second input (D) of the second flip flop 204 is coupled to the d1 output of the second logic gate 214, the example second clock input of the second flip flop 204 is coupled to the VCO 108 (FIG. 1) to receive the first clock signal ($f_{vco}$) 101, the example second output (Q) is coupled to the DOWN logic gate input of the first logic gate 206, and the second reset input (R) of the second flip flop 204 is coupled to the main reset output of the delay cell 210. The DOWN input of the example second logic gate 214 is coupled to the second output of the second flip flop 204 to receive the DOWN signal 107. The DOWN input of the example one-shot circuit 212 is coupled to the second output of the second flip flop 204 to receive the DOWN signal 107.

In FIG. 2, the example third input (D) of the third flip flop 208 is coupled to the supply voltage ($V_{DD}$), the example third clock input of the third flip flop 208 is coupled to VCO 108 (FIG. 1) to receive the first clock signal ($f_{vco}$) 101, the third output (Q) of the third flip flop 208 is coupled to the q1 input of the second logic gate 214, and the third reset input of the third flip flop 208 is coupled to the reset output (R1) of the one-shot circuit 212. The example third flip flop 208 generates a q1 voltage that is input into the q1 input of the second logic gate 214.

In an example operation of the PFD 102 of FIG. 2, the pulse swallowing circuitry 200 operates in a divide by 2 implementation, where the factor N is equal to 2. In the example operation, the first flip flop 202 samples the second clock signal 103 to generate the UP signal 105. For example, the first flip flop 202 latches and/or outputs a logic one at the first output (Q) when the first clock input obtains a rising edge in the second clock signal ($f_{ref}$) 103. In this manner, when the second clock signal 103 goes high, the UP signal 105 goes high. The example second flip flop 204 is supposed to sample the first clock signal ($f_{vco}$) 101 that has been divided by an integer divider to generate the DOWN signal 107. However, the example second flip flop 204 and/or more generally, the example PFD 102 of FIGS. 1 and 2, directly samples the first clock signal ($f_{vco}$) 101 and eliminates the need for the integer divider. In this manner, the example PFD 102 must implement an element that divides the first clock signal ($f_{vco}$) 101 by the factor N and/or mimics a sampling of a divided first clock signal ($f_{vco}$) 101. In this manner, the pulse swallowing circuitry 200 enables the second flip flop 204 to sample the first clock signal ($f_{vco}$) 101 on every Nth edge of the first clock signal ($f_{vco}$) 101, where the Nth edge that is sampled is determined based on the factor N. In this example, the second flip flop 204 is to sample every alternate edge of the first clock signal ($f_{vco}$) 101 for the divide by 2 implementation of the pulse swallowing circuitry 200. During the example operation of the PFD 120, when the example second flip flop 204 samples the first clock signal ($f_{vco}$) 101 on every Nth edge of the first clock signal ($f_{vco}$) 101, the DOWN signal 107 goes high with respect to the Nth edges of the first clock signal ($f_{vco}$) 101.

For example, when the third flip flop 208 obtains a rising edge in the first clock signal ($f_{vco}$) 101, the third output (Q) latches the supply voltage and q1 voltage goes high. Simultaneously, the second flip flop 204 obtains the rising edge in the first clock signal ($f_{vco}$) 101 and the second output (Q) latches the value on q1, which is zero at the time the first clock signal 101 goes high. So the DOWN signal 107 is low. On the next period of the first clock signal ($f_{vco}$) 101, q1 voltage is high and the d1 output of the second logic gate 214 is high. Therefore, when the second flip flop 204 obtains a second rising edge in the first clock signal ($f_{vco}$) 101, the second output (Q) latches d1 output, and outputs a rising edge on the DOWN signal 107. In this example, the second flip flop 204 latched the alternate edge of the first clock signal ($f_{vco}$) 101.

In the example operation, when the DOWN signal 107 goes high, the second flip flop 204 is to be prepared to sample the next alternate edge of the first clock signal ($f_{vco}$) 101. For example, in order to avoid sampling every edge of the first clock signal ($f_{vco}$) 101, the third flip flop 208 is to be reset so that at the next edge of the first clock signal ($f_{vco}$) 101, d1 output is low. To achieve this, when the DOWN signal 107 goes high, the one-shot circuit 212 is triggered. The example one-shot circuit 212 generates a high voltage at the reset output (R1) which resets third flip flop 208. Resetting the third flip flop 208 includes outputting a low voltage at the third output q1. In this example, the second logic gate 214 obtains a low voltage at the q1 input. However, during the time that the one-shot circuit 212 is triggered, the DOWN signal 107 is still high and, thus, the DOWN input of the second logic gate 214 is high, which indicates that the d1 output is high. To ensure that the d1 output is low at the next edge of the first clock signal ($f_{vco}$) 101, the example first logic gate 206 and the example delay cell 210 work together to reset the second flip flop 204.

For example, the DOWN signal 107 is reset by the delay cell 210 in order to ensure that d1 output is low by the next edge of the first clock signal ($f_{vco}$) 101. The example delay cell 210 resets the DOWN signal 107 responsive to a logic high UP signal 105 and a logic high DOWN signal 107. For example, when the UP logic gate input and the DOWN logic gate input are both high, the voltage aout goes high. The delay cell 210 outputs a high voltage on the main reset output after a particular delay. The high voltage on the main reset output resets the first output of the first flip flop 202 and the second output of the second flip flop 204. Resetting the first output and the second output includes outputting a low UP signal 105 and a low DOWN signal 107. For example, the UP signal 105 and the down signal 107 both go low when the delay cell 210 outputs a logic high. In some examples, the particular delay implemented by the delay cell 210 is just enough to cause the DOWN input of the second logic gate 214 to go low and, thus, d1 output to go low, before the next edge of the first clock signal ($f_{vco}$) 101. In this manner, when the next edge of the first clock signal ($f_{vco}$) 101 is obtained by the second clock input, the second output latches the low voltage at the d1 output, and the DOWN signal 107 remains low.

At the next edge of the first clock signal ($f_{vco}$) 101, the third flip flop 208 latches the supply voltage ($V_{DD}$) and outputs a high q1 voltage. The d1 output goes high responsive to the q1 voltage going high. In this example, at the alternate edge of the first clock signal ($f_{vco}$) 101, the second flip flop 204 latches the d1 output and the DOWN signal 107 goes high. The example operation of the third flip flop 208, the one-shot circuit 212, and the delay cell 210 repeats to ensure that the d1 output is low before the next edge of the first clock signal ($f_{vco}$) 101.

Advantageously, the example PFD 102 of FIGS. 1 and 2 includes the pulse swallowing circuitry 200 to mimic sampling a divided first clock signal ($f_{vco}$) 101 by implementing the third flip flop 208 and the one-shot circuit 212 to swallow and/or ignore every alternate and/or Nth edge of the first clock signal ($f_{vco}$) 101. The example flip flops 202, 204, and 208 of FIG. 2 are not noise critical (e.g., they contribute zero noise to achieve operation of frequency division of the first clock signal 101 as they directly sample the first clock signal 101) and, thus, the design constraints for the flip flop 202, 204, and 208 can be relaxed, reducing overall power consumption of the PFD 102.

Figure 3:
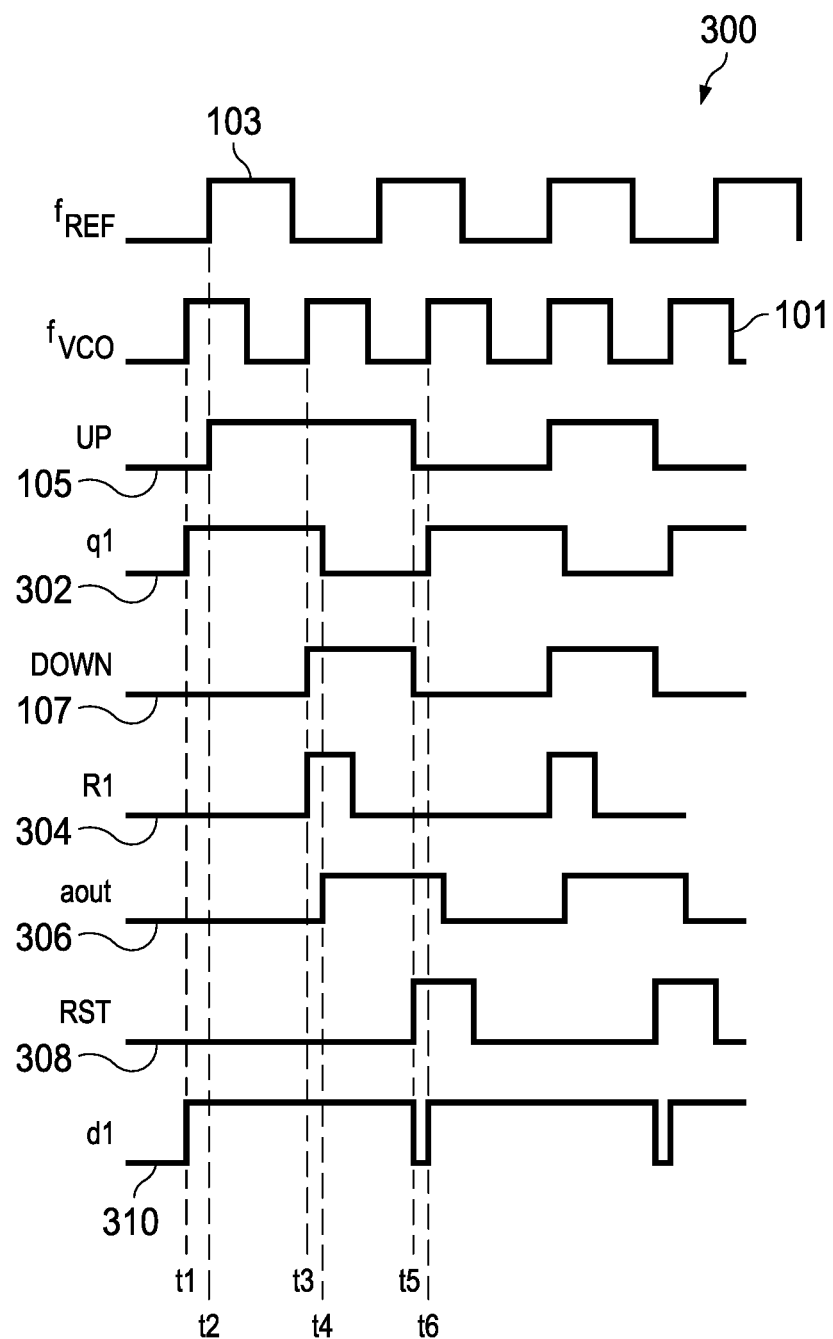
FIG. 3 is an example first timing diagram to illustrate signals through the example phase frequency detector of FIG. 2 during an example operation.

FIG. 3 is an example first timing diagram 300 to illustrate the signals through the example PFD 102 of FIG. 2 during the example operation described above. For example, the first timing diagram 300 depicts the signals through the PFD 102 of FIG. 2 when the PFD 102 is to implement a divide by two operation. The example first timing diagram 300 includes the example second clock signal ($f_{ref}$) 103, the example first clock signal ($f_{vco}$) 101, the example UP signal 105, an example q1 signal 302, the example DOWN signal 107, an example reset signal 304, an example aout signal 306, an example main reset signal 308, and an example d1 signal 310. In FIG. 3, the example q1 signal 302 corresponds to the q1 voltage output by the third output of the third flip flop 208, the example reset signal 304 corresponds to the reset (R1) output of the example one-shot circuit 212, the example aout signal 306 corresponds to the logic gate output of the first logic gate 206, the example main reset signal 308 corresponds to the main reset output of the example delay cell 210, and the d1 signal corresponds to the d1 output of the example second logic gate 214.

The example first timing diagram 300 begins at a first time, t1. At the first time, t1, the first clock signal ($f_{vco}$) 101 includes a first rising edge. For example, at the first time, t1, the first clock signal ($f_{vco}$) 101 goes from low to high. The example second flip flop 204 maintains a low output on the DOWN signal 107 at the first time, t1, because the second flip flop 204 is to sample the first clock signal ($f_{vco}$) 101 at every alternate edge, and the first rising edge at the first time is not an alternate edge. The example third flip flop 208 obtains the first rising edge of the first clock signal ($f_{vco}$) 101 at the first time, t1, and latches the supply voltage ($V_{DD}$) causing the q1 signal 302 to go high. The example second logic gate 214 outputs a high voltage on the d1 signal 310 responsive to obtaining the high q1 signal 302 at the first time, t1. However, since the d1 signal 310 goes from low to high at the first time t1, the second flip flop 204 latches the low voltage at the d1 output when the first rising edge of the first clock signal ($f_{vco}$) 101 is obtained and, thus, the second flip flop 204 outputs a low DOWN signal 107. At the first time, t1, the first rising edge of the first clock signal ($f_{vco}$) 101 is swallowed by the second and third flip flops 204, 208.

At a second time, t2, the second clock signal ($f_{ref}$) 103 includes a first rising edge. For example, at the second time, t2, the second clock signal ($f_{ref}$) 103 goes from low to high. The example first flip flop 202 outputs a high UP signal 105 at the second time, t2, responsive to receiving the first rising edge of the second clock signal ($f_{ref}$) 103. For example, the first flip flop 202 latches the supply voltage ($V_{DD}$) on the first data input at the first output. At the second time, t2, the UP signal 105 is high (e.g., logic high, high voltage, etc.) and the DOWN signal 107 is low (e.g., logic low, low voltage, etc.).

At a third time, t3, the first clock signal ($f_{vco}$) 101 includes a second rising edge. The example second flip flop 204 latches the voltage (e.g., the d1 signal 310) at the d1 output responsive to the second rising edge. For example, the second output of the second flip flop 204 outputs a high DOWN signal 107 at the third time, t3, responsive to the second clock input obtaining the second rising edge of the first clock signal ($f_{vco}$) 101. In this example, the second flip flop 204 sampled the alternate edge of the first clock signal ($f_{vco}$) 101 by outputting a high DOWN signal 107 responsive to the second rising edge of the first clock signal ($f_{vco}$) 101. The following description of the signals through the PFD 102 between the third time, t3, and a sixth time, t6, describe how the PFD 102 prepares to avoid sampling the next (e.g., third) edge of the first clock signal ($f_{vco}$) 101.

For example, the example one-shot circuit 212 is triggered responsive to the DOWN signal 107 going high at the third time, t3. The example one-shot circuit 212 outputs a pulse (e.g., a period of high voltage) on the reset signal 304 at the third time, t3, to reset the example third flip flop 208.

At a fourth time, t4, the example third flip flop 208 outputs a low q1 signal 302 responsive to the high reset signal 304. For example, the high reset signal 304 resets the third flip flop 208 and, thus, the third output (e.g., the q1 signal 302) of the third flip flop 208 goes low. The example second logic gate 214 includes a logic low (e.g., a logic zero) at the q1 input at the fourth time, t4. At the fourth time, t4, the example first logic gate 206 outputs a high voltage on the aout signal 306 responsive to the DOWN signal 107 going high at the third time, t3. For example, at the third time, t3, the UP signal 105 is high and the DOWN signal 107 goes high. The example first logic gate 206 obtains the two high inputs and outputs a high voltage output.

At a fifth time, t5, the delay cell 210 outputs a pulse and the main reset signal 308 goes high. The delay cell 210 receives the high voltage of the aout signal 306 at the fourth time, t4, and waits for a period of time to output the pulse on the main reset signal 308. For example, the period of time the delay cell 210 waits is the time between the fourth time, t4, and the fifth time, t5. The example first flip flop 202 resets at the fifth time, t5, responsive to the pulse on the main reset signal 308. The UP signal 105 goes low at the fifth time, t5, responsive to the resetting of the first flip flop 202. The example second flip flop 204 resets at the fifth time, t5, responsive to the pulse on the main reset signal 308. The DOWN signal 107 goes low at the fifth time, t5, responsive to the resetting of the second flip flop 204. The example second logic gate 214 obtains the low DOWN signal 107 at the DOWN input and outputs a low d1 signal 310. For example, at the fifth time t5, the q1 signal 302 is low and the DOWN signal 107 is low and, thus, the d1 output of the second logic gate 214 goes low.

At the sixth time, t6, the first clock signal ($f_{vco}$) 101 includes a third rising edge. The example second flip flop 204 latches the low voltage (e.g., the low d1 signal 310) at the d1 output responsive to the third rising edge. For example, the second output of the second flip flop 204 maintains a low DOWN signal 107 at the sixth time, t6, responsive to the second clock input obtaining the third rising edge of the first clock signal ($f_{vco}$) 101. In this example, the second flip flop 204 swallowed the third edge of the first clock signal ($f_{vco}$) 101, which was not an alternate edge from the second edge, by maintaining a low DOWN signal 107. The example second flip flop 204 maintained the low DOWN signal 107 due to the low d1 signal 310 before the sixth time, t6.

The example operation of the PFD 102 repeats similarly from the first time, t1, to the sixth time, t2, for the next edges (e.g., a fourth edge, a fifth edge, and a sixth edge) of the first clock signal ($f_{vco}$) 101 to sample the alternate edges of the first clock signal ($f_{vco}$) 101.

FIG. 4 is an example schematic diagram of a pulse swallowing circuit 400 that implements a divide by N operation. The example pulse swallowing circuit 400 is dynamic to enable an adjustment of the sampling edges when the N factor changes. For example, the pulse swallowing circuit 400 includes N flip flops 408A, 408B, 408N-1, and 408N that can be activated, initiated, etc., based on values of N control signals 409A, 409B, 409N-1, and 409N.

The example pulse swallowing circuit 400 includes an example one-shot circuit 412, an example logic gate 414, and example N multiplexers 416A, 416B, 416N-1, and 416N. The example pulse swallowing circuit 400 is coupled to an example DOWN flip flop 406.

In FIG. 4, the example DOWN flip flop 406 may be implemented by and/or perform the same operation as the example second flip flop 208 of FIG. 2. The example N flip flops 408A, 408B, 408N-1, and 408N may be implemented by at least the example third flip flop 208 of FIG. 2. The example one-shot circuit 412 may be implemented by and/or perform the same operation as at least the example one-shot circuit 212 of FIG. 2. The example logic gate 414 may be implemented by and/or perform the same operation as at least the example second logic gate 214 of FIG. 2.

In FIG. 4, an example first N flip flop 408A includes a data input (D), a reset input (R), a clock input, and an output (Q). An example second N flip flop 408B includes a data input (D), a reset input (R), a clock input, and an output (Q). An example N-1 N flip flop 408N-1 includes a data input (D), a reset input (R), a clock input, and an output (Q). An example Nth N flip flop 408N includes a data input (D), a reset input (R), a clock input, and an output (Q).

In FIG. 4, an example first multiplexer 416A includes a select line, a first input (0), a second input (1), and an output. An example second multiplexer 416B includes a select line, a first input (0), a second input (1), and an output. An example N-1 multiplexer 416N-1 includes a select line, a first input (0), a second input (1), and an output. An example Nth multiplexer 416N includes a select line, a first input (0), a second input (1), and an output.

In FIG. 4, the example DOWN flip flop 406 and the example N flip flops 408A, 408B, 408N-1, and 408N obtain a first clock signal 401 at respective clock inputs. In this example, the first clock signal 401 may be the first clock signal 101 of FIGS. 1 and 2, such as a clock signal output by a voltage controlled oscillator. The example DOWN flip flop 406 is operable to generate an example DOWN signal 407, which may be the DOWN signal 107 of FIGS. 1 and 2.

In FIG. 4, an example output (d1) of the logic gate 414 is coupled to the data input (D) of the DOWN flip flop 406. An example output (Q) of the DOWN flip flop 406 is coupled to an input of the one-shot circuit 412. An example output of the one-shot circuit 412 is coupled to the reset inputs (R) of the example first N flip flop 408A, the example second N flip flop 408B, the example N-1 N flip flop 408N-1, and the example Nth N flip flop 408N. An example first input of the logic gate 414 is coupled to the output (Q) of the DOWN flip flop 406. The example output of the first multiplexer 416a is coupled to a second input of the logic gate 414.

The example first input of the first multiplexer 416A is coupled to a supply voltage and/or configured to receive a logic high voltage. The example second input of the first multiplexer 416A is coupled to the output (Q) of the first N flip flop 408A. The example select line of the first multiplexer 416A is configured to receive an example N control signal 409A. In this example, the N control signal 409A may be the N control signal 109 of FIG. 1, such as a control signal that informs a PLL of the N factor and/or the ratio between a reference clock signal and an output clock signal. In some examples, only a portion (409A) of the N control signal 409 is input to the select line of the first multiplexer 416A.

In FIG. 4, the output of the second multiplexer 416B is coupled to the data input of the first N flip flop 408A. The first input of the second multiplexer 416B is coupled to a supply voltage and/or configured to receive a logic high voltage. The example second input of the second multiplexer 416B is coupled to the output (Q) of the second N flip flop 408B. The example select line of the second multiplexer 416B is configured to receive an example N control signal 409B, which is a portion of the N control signal 409. The data input of the second N flip flop 408B is coupled to an output of a multiplexer, not shown.

In FIG. 4, the output of the N-1 multiplexer 416N-1 is coupled to a data input of a flip flop, not shown. The first input of the N-1 multiplexer 416N-1 is coupled to a supply voltage and/or configured to receive a logic high voltage. The example second input of the N-1 multiplexer 416N-1 is coupled to the output (Q) of the N-1 N flip flop 408N-1. The example select line of the N-1 multiplexer 416N-1 is configured to receive an example N control signal 409N-1, which is a portion of the N control signal 409.

In FIG. 4, the output of the Nth multiplexer 416N is coupled to the data input of the N-1 N flip flop 408N-1. The first input of the Nth multiplexer 416N is coupled to a supply voltage and/or configured to receive a logic high voltage. The example second input of the Nth multiplexer 416N is coupled to the output (Q) of the Nth N flip flop 408N. The example select line of the Nth multiplexer 416N is configured to receive an example N control signal 409N, which is a portion of the N control signal 409.

The example N multiplexers 416A, 416B, 416N-1, and 416N pass information from respective previous flip flops 408A, 408B, 408N-1, and 408N depending on the type of ratio and/or division that is selected for the pulse swallowing circuit 400. For example, in a divide by two implementation where the pulse swallowing circuit 400 is to enable a sampling of every alternate edge of the first clock signal 401, the N control signal 409 is equivalent to [00 . . . 01]. In such an example, the first multiplexer 416A obtains a digital 1 at the select line, which informs the first multiplexer 416A to select whatever value is on the second input. For example, the first multiplexer 416A will select the value on the output (Q) of the first N flip flop 408A to forward to the logic gate input (q1) 414. In this example, the remaining the N multiplexers 416B, 416N-1, and 416N obtain a digital 0 at their respective select lines, which will cause the N multiplexers 416B, 416N-1, and 416N to output and/or select the value "1" on the first input of the N multiplexers 416B, 416N-1, and 416N.

In some examples, the pulse swallowing circuit 400 is to implement a divide by three operation, where the pulse swallowing circuit 400 is to enable a sampling of every second alternate edge of the first clock signal 401. In such an example divide by three operation of the pulse swallowing circuit 400, the N control signal 409 is equivalent to the binary value [00 . . . 11]. In this example, the first multiplexer 416A receives a digital 1 at the select line, the second multiplexer 416B receives a digital 1 at the select line, and the N-1 multiplexer 416N-1 and the Nth multiplexer 416N receive a digital 0 at their respective select lines. As such, the example second multiplexer 416B selects the value on the output (D) of the second N flip flop 408B to forward to the data input (D) of the first N flip flop 408A and the example first multiplexer 416A selects the value on the output (D) of the first N flip flop 408B to forward to the logic gate input (q1) 414).

The example pulse swallowing circuit 400 may include any number of flip flops and multiplexers to implement an appropriate and/or desired division of the first clock signal 401. A particular division can be achieved by the number of flip flops based on enabling a desired multiplexer, corresponding to the particular division (e.g., the second multiplexer 416B to enable divide by three, a third multiplexer (not show) to enable a divide by four, the Nth multiplexer 416N to enable a divide by N), and all of the multiplexers coupled between the desired multiplexer and the logic gate 414. As used herein, enabling a multiplexer includes inputting a digital and/or logic 1 at the select line, causing the multiplexer to select and forward data on the second input (1), etc. The example pulse swallowing circuit 400 does not introduce noise on the first clock signal 401 because the DOWN flip flop 406 operates directly on and/or with the first clock signal 401.

FIG. 5 is a block diagram of a phase-locked loop (PLL) 500 including an integer divider 502 in a feedback network. The PLL 500 of FIG. 5 is to synchronize an output clock signal 501 with a reference clock signal 503. The PLL 500 of FIG. 5 includes the integer divider 502, a phase frequency detector (PFD) 504, a charge pump 506, a loop filter 508, and a voltage controlled oscillator (VCO) 510.

In FIG. 5, the PFD 504 is coupled to an output of the integer divider 502 and configured to receive a feedback clock signal 505 and the reference clock signal 503. The PFD 504 is to bring a frequency of the feedback clock signal 505 closer to a frequency of the reference clock signal 503. For example, the PFD 504 is to detect a phase difference between the feedback clock signal 505 and the reference clock signal 503 and translate the phase difference into two signals—UP signal and down signal, which are used to adjust the frequency of the output clock signal 501 to be in-phase with the frequency of the reference clock signal 503. In some examples, the output clock signal 501 has a frequency that is greater than the frequency of the reference clock signal 503 by a factor of N. In such an example, the output clock signal 501 has to be divided by the same factor N, in order for the PFD 504 to accurately detect the phase difference between the output clock signal 501 and the reference clock signal 503. The PFD 504 is configured to receive the feedback clock signal 505, which represents a divided output clock signal 501. The feedback clock signal 505 is generated by the integer divider 502. Therefore, the PFD 504 of FIG. 5 does not include pulse swallowing circuitry and, thus, may receive a feedback clock signal 505 that includes undesired levels of noise.

In FIG. 5, the integer divider 502 is to divide the output clock signal 501 by a factor of N to generate the feedback clock signal 505. The integer divider 502 may induce noise in the feedback clock signal 505 due to a flip flop in the integer divider 502 sampling every Nth alternate edge to produce the divided frequency. Once sampling occurs, device noise from the flip flop will inevitably add to produced divided clock (e.g., to the feedback clock signal 505) directly as well as by noise folding (e.g., up sampling). In some examples, the integer divider 502 may be designed such that less noise is induced in the feedback clock signal 505. However, such a design requires extra power investment, increasing the overall power consumption of the PLL 500.

For example, turning to FIG. 6, an example second timing diagram 600 is illustrated to depict the noise added by the integer divider 502 of FIG. 5 between the output clock signal 501 and the feedback clock signal 503. The example second timing diagram 600 includes the output clock signal 501 (FIG. 5) and the feedback clock signal 505 (FIG. 5).

At a first time, t1, the VCO 510 (FIG. 5) outputs a rising edge on the output clock signal 501. The integer divider 502 (FIG. 5) obtains the rising edge of the output clock signal 501 at the first time, t1, and performs integer division to output an appropriate edge on the feedback clock signal 505.

At a second time, t2, the integer divider 502 outputs a rising edge on the feedback clock signal 505. The rising edge of the feedback clock signal 505 occurs at a period of time after the rising edge of the output clock signal 501. The period of time between the two rising edges introduces a delay in the feedback network of the PLL 500, causing inaccurate phase detection between the output clock signal 501 and the reference clock signal 503. Such a delay is indicative of the noise added from the integer divider 502.

To remove this unwanted delay between the rising edges of the output clock signal 501 and the feedback clock signal 505, the integer divider 502 may be designed as such, but requires extra power. Therefore, a tradeoff exists in the design of the PLL 500. Advantageously, such a tradeoff does not exist for a PLL including a phase frequency detector having pulse swallowing circuitry, such as the PFD 102 of FIG. 2.

Turning back to the description of FIG. 5, the PLL 500 includes the charge pump 506 to generate an output current at its output that increases, decreases, and/or does not change a voltage supplied to the VCO 510 based on the output of the PFD 504.

In FIG. 5, the loop filter 508 is configured to receive the output current from the charge pump 506. The loop filter 508 generates an output voltage that increases, decreases and/or remains constant based on the output current. For example, the loop filter 508 may comprise a capacitor that is to be charged and/or discharged by the output current based on the output of the PFD 504. The loop filter 508 supplies the VCO 510 with the output voltage that causes the VCO 510 to adjust the frequency of the output clock signal 501.

In FIG. 5, the VCO 510 is configured to receive the output voltage from the loop filter 508. The VCO 510 modulates the reference clock signal 503 based on the output voltage of the loop filter 508 to generate the output clock signal 501. In some examples, the VCO 510 generates a clock signal that is greater in frequency than the reference clock signal 503 by a factor of N. In some examples, the output clock signal 501 generated by the VCO 510 may not be in phase with the reference clock signal 503 due to the delay and/or noise introduced by the integer divider 502.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

Example methods, apparatus and articles of manufacture described herein improve the accuracy of phase locked loops by eliminating the need for an integer divider and feeding an output clock signal directly to the phase frequency detector. The accuracy of the phase locked loops are increase and/or improved from pulse swallowing circuitry integrated in the phase frequency detector that mimics the operation of the integer divider. By removing the integer dividers from the feedback networks of the phase locked loops, noise is removed between the output clock signal and the reference clock signal and the phase frequency detectors can accurately detect a phase difference between the output clock signal and reference clock signal. Example methods, apparatus and articles of manufacture described herein advantageously improve the overall power consumption of phase locked loops by eliminating the need for integer dividers in feedback networks.

Example methods, apparatus, systems, and articles of manufacture to implement pulse swallowing circuitry in a phase frequency detector are disclosed herein. Further examples and combinations thereof include the following:

Example 1 includes a phase frequency detector (PFD) comprising a first flip flop having a first output and a first reset input, a second flip flop having a first data input, a second output, and a second reset input, the second reset input coupled to the first reset input, a logic gate having a first logic gate input, a second logic gate input, and a first logic gate output, the first logic gate input coupled to the first output and the second logic gate input coupled to the second output, a delay cell having a delay cell input and a delay cell output, the delay cell input coupled to the first logic gate output and the delay cell output coupled to the first reset input and the second reset input, and pulse swallowing circuitry having a circuitry input and a circuitry output, the circuitry input coupled to the second output and the circuitry output coupled to the first data input.

Example 2 includes the PFD of example 1, wherein the logic gate is a first logic gate, the pulse swallowing circuitry further comprises a third flip flop having a third reset input and a third output, a second logic gate having a third logic gate input, a fourth logic gate input, and a second logic gate output, the third logic gate input coupled to the second output, the fourth logic gate input coupled to the third output, and the second logic gate output coupled to the first data input, and a one-shot circuit having a one-shot input and a one-shot output, the one-shot input coupled to the second output and the one-shot output coupled to the third reset input.

Example 3 includes the PFD of example 1, wherein the first flip flop further comprises a first clock input and the second flip flop further comprises a second clock input, the first clock input is configured to receive a reference clock signal and the second clock input is configured to receive a modulated clock signal.

Example 4 includes the PFD of example 3, wherein the modulated clock signal has a first frequency that is N times a size of a second frequency corresponding to reference clock signal.

Example 5 includes the PFD of example 1, wherein the logic gate is a first logic gate, the pulse swallowing circuitry further comprises a third flip flop having a third reset input, a third output, and a clock input, the clock input configured to receive a modulated clock signal, a second logic gate having a third logic gate input, a fourth logic gate input, and a second logic gate output, the third logic gate input coupled to the second output, the fourth logic gate input coupled to the third output, and the second logic gate output coupled to the first data input, and a one-shot circuit having a one-shot input and a one-shot output, the one-shot input coupled to the second output and the one-shot output coupled to the third reset input.

Example 6 includes the PFD of example 5, wherein the first logic gate comprises a logic AND gate and the second logic gate comprises a logic OR gate.

Example 7 includes the PFD of example 1, wherein the first flip flop further includes a first clock input, the second flip flop further includes a second clock input, and the pulse swallowing circuitry further comprises a third flip flop having a third clock input, the third clock input and the second clock input configured to receive a modulated clock signal and the first clock input configured to receive a reference clock input, the modulated clock signal having a first frequency that is N times a size of a second frequency corresponding to reference clock signal.

Example 8 includes a system comprising a phase frequency detector having a first input, a second input, a third input, a first output, and a second output, a charge pump having a third output, the charge pump coupled to the first and second output, a loop filter having a fourth output, the loop filter coupled to the third output, a voltage controlled oscillator coupled to the fourth output and having a fifth output directly coupled to the first input of the phase frequency detector.

Example 9 includes the system of example 8, wherein the second input is configured to receive a reference clock signal and the third input is configured to receive a control signal, the control signal indicative of a ratio between the reference clock signal and the fifth output of the voltage controlled oscillator.

Example 10 includes the system of example 8, wherein the phase frequency detector further comprises a first flip flop having a first clock input, a first reset input, and a first data output, the first clock input configured to receive a reference clock signal and the first data output coupled to the charge pump, a second flip flop having a first data input, a second clock input, a second reset input, and a second data output, the second clock input coupled to the fifth output, the second reset input coupled to the first reset input, and the second data output coupled to the charge pump, a logic gate having a first logic gate input, a second logic gate input, and a first logic gate output, the first logic gate input coupled to the first data output and the second logic gate input coupled to the second data output, a delay cell having a delay cell input and a delay cell output, the delay cell input coupled to the first logic gate output and the delay cell output coupled to the first reset input and the second reset input, and pulse swallowing circuitry having a circuit input and a circuit output, the circuit input coupled to the second data output and the circuit output coupled to the first data input.

Example 11 includes the system of example 8, wherein the phase frequency detector further comprises pulse swallowing circuitry coupled to the fifth output.

Example 12 includes the system of example 8, wherein the first output is configured to include an UP signal indicative of a reference clock signal and the second output is configured to include a DOWN signal indicative of a modulated signal.

Example 13 includes the system of example 12, wherein the fifth output of the voltage controlled oscillator is configured to include the modulated signal, wherein the modulated signal includes a first frequency that is N times a second frequency corresponding to the reference clock signal.

Example 14 includes the system of example 8, wherein the phase frequency detector further comprises a first flip flop having a first clock input, a first reset input, and a first data output, the first clock input configured to receive a reference clock signal and the first data output coupled to the charge pump, a second flip flop having a first data input, a second clock input, a second reset input, and a second data output, the second clock input coupled to the fifth output, the second reset input coupled to the first reset input, and the second data output coupled to the charge pump, a second logic gate having a first logic gate input, a second logic gate input, and a first logic gate output, the first logic gate input coupled to the first data output and the second logic gate input coupled to the second data output, a delay cell having a delay cell input and a delay cell output, the delay cell input coupled to the first logic gate output and the delay cell output coupled to the first reset input and the second reset input, and pulse swallowing circuitry comprising a third flip flop having a third clock input, a third reset input, and a third data output, the third clock input configured to be coupled to the fifth output, a second logic gate having a third logic gate input, a fourth logic gate input, and a second logic gate output, the third logic gate input coupled to the second data output, the fourth logic gate input coupled to the third data output, and the second logic gate output coupled to the first data input, and a one-shot circuit having a one-shot input and a one-shot output, the one-shot input coupled to the second data output and the one-shot output coupled to the third reset input.

Example 15 includes a method comprising latching a low voltage at a first flip flop output responsive to a first rising edge on a first clock signal, latching a high voltage at a second flip flop output responsive to the first rising edge on the first clock signal, inputting a high voltage at a first flip flop input responsive to latching the high voltage at the second flip flop output, and latching the high voltage on the first flip flop input at the first flip flop output responsive to a second rising edge on the first clock signal, the second rising edge occurring at a time after the first rising edge.

Example 16 includes the method of example 15, further including triggering a one-shot circuit responsive to the high voltage at the first flip flop output responsive to the second rising edge of the first clock signal.

Example 17 includes the method of example 15, further including triggering a one-shot circuit responsive to the high voltage at the first flip flop output responsive to the second rising edge of the first clock signal, resetting the second flip flop output responsive to triggering the one-shot circuit, the one-shot circuit to input a pulse at a second flip flop reset input, and providing a low voltage to a logic gate responsive to resetting the second flip flop output.

Example 18 includes the method of example 15, further including providing the high voltage on the first flip flop output to a logic AND gate responsive to the second rising edge on the first clock signal. latching a high voltage at a third flip flop output responsive to a first rising edge on a second clock signal, the second clock signal out of phase with the first clock signal, providing the high voltage on the third flip flop output to the logic AND gate, and outputting a reset signal to a first flip flop reset input and a third flip flop reset input responsive to the high voltage from the first flip flop output and the high voltage from the third flip flop output, the reset signal to reset the first flip flop output and the third flip flop output.

Example 19 includes the method of example 15, further including triggering a one-shot circuit responsive to the high voltage at the first flip flop output responsive to the second rising edge of the first clock signal, resetting the second flip flop output responsive to triggering the one-shot circuit, the one-shot circuit to input a pulse at a second flip flop reset input, providing a low voltage to a first logic gate responsive to resetting the second flip flop output, providing the high voltage on the first flip flop output to a logic AND gate responsive to the second rising edge on the first clock signal. latching a high voltage at a third flip flop output responsive to a first rising edge on a second clock signal, the second clock signal out of phase with the first clock signal, providing the high voltage on the third flip flop output to the logic AND gate, outputting a reset signal to a first flip flop reset input and a third flip flop reset input responsive to the high voltage from the first flip flop output and the high voltage from the third flip flop output, the reset signal to reset the first flip flop output and the third flip flop output, inputting a low voltage at the first flip flop input responsive to latching the first flip flop output resetting, and latching a low voltage at the first flip flop output responsive to a third rising edge on the first clock signal, the third rising edge occurring at a time after the second rising edge.

Example 20 includes the method of example 15, further including determining a ratio N between the first clock signal and a second clock signal, sampling the first clock signal at every Nth edge of the first clock signal, wherein every Nth edge corresponds to the ratio N.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described embodiments, and other embodiments are possible, within the scope of the claims.

What is claimed is:

1. A phase frequency detector (PFD) comprising:
   a first flip flop having a first output and a first reset input;
   a second flip flop having a first data input, a second output, and a second reset input, the second reset input coupled to the first reset input;
   a first logic gate having a first logic gate input, a second logic gate input, and a first logic gate output, the first logic gate input coupled to the first output and the second logic gate input coupled to the second output;
   a delay cell having a delay cell input and a delay cell output, the delay cell input coupled to the first logic gate output and the delay cell output coupled to the first reset input and the second reset input; and
   pulse swallowing circuitry having a circuitry input and a circuitry output, the circuitry input coupled to the second output and the circuitry output coupled to the first data input, the pulse swallowing circuitry further comprising:
      a third flip-flop having a third reset input and a third output;
      a second logic gate having a third logic gate input, a fourth logic gate input, and a second logic gate output, the third logic gate input coupled to the second output, the fourth logic gate input coupled to the third output, and the second logic gate output coupled to the first data input; and
      a one-shot circuit having a one-shot input and a one-shot output, the one-shot input coupled to the second output and the one-shot output coupled to the third reset input.

2. The PFD of claim 1,
   wherein the first flip flop further comprises a first clock input and the second flip flop further comprises a second clock input, the first clock input is configured to receive a reference clock signal and the second clock input is configured to receive a modulated clock signal.

3. The PFD of claim 2, wherein the modulated clock signal has a first frequency that is N times that of a second frequency corresponding to reference clock signal.

4. The PFD of claim 1, wherein the third flip flop has a clock input configured to receive a modulated clock signal.

5. The PFD of claim 4, wherein the first logic gate comprises a logic AND gate and the second logic gate comprises a logic OR gate.

6. A phase frequency detector (PFD) comprising:
   a first flip flop having a first output and a first reset input;
   a second flip flop having a first data input, a second output, and a second reset input the second reset input coupled to the first reset input,
   a logic gate having a first logic gate input, a second logic gate input, and first logic gate output, the first logic gate input coupled to the first output and the second logic gate input coupled to the second output,
   a delay cell having a delay cell input and a delay cell output, the delay cell input coupled to the first logic gate output and the delay cell output coupled to the first reset input and the second reset input; and
   pulse swallowing circuitry having a circuitry input and a circuitry output, the circuitry input coupled to the second output and the circuitry output coupled to the first data input,
   wherein the first flip flop further includes a first clock input, the second flip flop further includes a second clock input, and the pulse swallowing circuitry further comprises:
      a third flip flop having a third clock input, the third clock input and the second clock input configured to receive a modulated clock signal and the first clock input configured to receive a reference clock input, the modulated clock signal having a first frequency that is N times that of a second frequency corresponding to reference clock signal.

7. A system comprising:
   a phase frequency detector having a first input, a second input, a third input, a first output, and a second output, the second input configured to receive a reference clock signal, and the third input configured to receive a control signal indicative of a ratio between the reference clock signal and the fifth output of the voltage controlled oscillator;
   a charge pump having a third output, the charge pump coupled to the first and second outputs;
   a loop filter having a fourth output, the loop filter coupled to the third output; and
   a voltage controlled oscillator coupled to the fourth output and having a fifth output directly coupled to the first input of the phase frequency detector.

8. The system of claim 7, wherein the phase frequency detector further comprises:
   a first flip flop having a first clock input, a first reset input, and a first data output, the first clock input configured to receive a reference clock signal and the first data output coupled to the charge pump;
   a second flip flop having a first data input, a second clock input, a second reset input, and a second data output, the second clock input coupled to the fifth output, the second reset input coupled to the first reset input, and the second data output coupled to the charge pump;
   a logic gate having a first logic gate input, a second logic gate input, and a first logic gate output, the first logic gate input coupled to the first data output and the second logic gate input coupled to the second data output;
   a delay cell having a delay cell input and a delay cell output, the delay cell input coupled to the first logic gate output and the delay cell output coupled to the first reset input and the second reset input; and
   pulse swallowing circuitry having a circuit input and a circuit output, the circuit input coupled to the second data output and the circuit output coupled to the first data input.

9. The system of claim 7, wherein the phase frequency detector further comprises pulse swallowing circuitry coupled to the fifth output.

10. The system of claim 7, wherein the first output is configured to transmit an UP signal indicative of a reference clock signal and the second output is configured to transmit a DOWN signal indicative of a modulated signal.

11. The system of claim 10, wherein the fifth output of the voltage controlled oscillator is configured to transmit the modulated signal, wherein the modulated signal includes a first frequency that is N times a second frequency corresponding to the reference clock signal.

12. The system of claim 7, wherein the phase frequency detector further comprises:
a first flip flop having a first clock input, a first reset input, and a first data output, the first clock input configured to receive a reference clock signal and the first data output coupled to the charge pump;
a second flip flop having a first data input, a second clock input, a second reset input, and a second data output, the second clock input coupled to the fifth output, the second reset input coupled to the first reset input, and the second data output coupled to the charge pump;
a second logic gate having a first logic gate input, a second logic gate input, and a first logic gate output, the first logic gate input coupled to the first data output and the second logic gate input coupled to the second data output;
a delay cell having a delay cell input and a delay cell output, the delay cell input coupled to the first logic gate output and the delay cell output coupled to the first reset input and the second reset input; and
pulse swallowing circuitry comprising:
a third flip flop having a third clock input, a third reset input, and a third data output, the third clock input configured to be coupled to the fifth output;
a second logic gate having a third logic gate input, a fourth logic gate input, and a second logic gate output, the third logic gate input coupled to the second data output, the fourth logic gate input coupled to the third data output, and the second logic gate output coupled to the first data input; and
a one-shot circuit having a one-shot input and a one-shot output, the one-shot input coupled to the second data output and the one-shot output coupled to the third reset input.

13. A method comprising:
latching a low voltage at a first flip flop output responsive to a first rising edge on a first clock signal;
latching a high voltage at a second flip flop output responsive to the first rising edge on the first clock signal;
inputting a high voltage at a first flip flop input responsive to latching the high voltage at the second flip flop output; and
latching the high voltage on the first flip flop input at the first flip flop output responsive to a second rising edge on the first clock signal, the second rising edge occurring at a time after the first rising edge.

14. The method of claim 13, further including triggering a one-shot circuit responsive to the high voltage at the first flip flop output responsive to the second rising edge of the first clock signal.

15. The method of claim 13, further including:
triggering a one-shot circuit responsive to the high voltage at the first flip flop output responsive to the second rising edge of the first clock signal;
resetting the second flip flop output responsive to triggering the one-shot circuit, the one-shot circuit to input a pulse at a second flip flop reset input; and
providing a low voltage to a logic gate responsive to resetting the second flip flop output.

16. The method of claim 13, further including:
providing the high voltage on the first flip flop output to a logic AND gate responsive to the second rising edge on the first clock signal;
latching a high voltage at a third flip flop output responsive to a first rising edge on a second clock signal, the second clock signal out of phase with the first clock signal;
providing the high voltage on the third flip flop output to the logic AND gate; and
outputting a reset signal to a first flip flop reset input and a third flip flop reset input responsive to the high voltage from the first flip flop output and the high voltage from the third flip flop output, the reset signal to reset the first flip flop output and the third flip flop output.

17. The method of claim 13, further including:
triggering a one-shot circuit responsive to the high voltage at the first flip flop output responsive to the second rising edge of the first clock signal;
resetting the second flip flop output responsive to triggering the one-shot circuit, the one-shot circuit to input a pulse at a second flip flop reset input;
providing a low voltage to a first logic gate responsive to resetting the second flip flop output;
providing the high voltage on the first flip flop output to a logic AND gate responsive to the second rising edge on the first clock signal;
latching a high voltage at a third flip flop output responsive to a first rising edge on a second clock signal, the second clock signal out of phase with the first clock signal;
providing the high voltage on the third flip flop output to the logic AND gate;
outputting a reset signal to a first flip flop reset input and a third flip flop reset input responsive to the high voltage from the first flip flop output and the high voltage from the third flip flop output, the reset signal to reset the first flip flop output and the third flip flop output;
inputting a low voltage at the first flip flop input responsive to latching the first flip flop output resetting; and
latching a low voltage at the first flip flop output responsive to a third rising edge on the first clock signal, the third rising edge occurring at a time after the second rising edge.

18. The method of claim 13, further including:
determining a ratio N between the first clock signal and a second clock signal; and
sampling the first clock signal at every Nth edge of the first clock signal, wherein every Nth edge corresponds to the ratio N.

* * * * *